United States Patent
Murari et al.

(10) Patent No.: US 6,171,931 B1
(45) Date of Patent: Jan. 9, 2001

(54) WAFER OF SEMICONDUCTOR MATERIAL FOR FABRICATING INTEGRATED DEVICES, AND PROCESS FOR ITS FABRICATION

(75) Inventors: Bruno Murari, Monza; Flavio Villa, Milano; Ubaldo Mastromatteo, Cornaredo, all of (IT)

(73) Assignee: SGS-Thomson Microelectronics S.r.l., Agrate Brianza (IT)

(*) Notice: Under 35 U.S.C. 154(b), the term of this patent shall be extended for 0 days.

(21) Appl. No.: 09/167,246

(22) Filed: Oct. 6, 1998

Related U.S. Application Data

(62) Division of application No. 08/571,806, filed on Dec. 13, 1995, now Pat. No. 5,855,693.

(30) Foreign Application Priority Data

Dec. 15, 1994 (EP) .................................................. 94830577

(51) Int. Cl.⁷ .................................................. H01L 21/46
(52) U.S. Cl. .................................................. 438/455; 438/406
(58) Field of Search .................................. 438/455, 459, 438/406, 404

(56) References Cited

U.S. PATENT DOCUMENTS 4,983,538 * 1/1991 Gotou .
5,413,952   5/1995 Pages et al. .......................... 438/406

FOREIGN PATENT DOCUMENTS

| 0 570 321 | 11/1993 | (EP) | ............................. H01L/21/76 |
| 5-160087 | * 6/1993 | (JP) . | |
| 91 11822 | 8/1991 | (WO) | ............................. H01L/21/70 |
| 93 01617 | 1/1993 | (WO) | ............................. H01L/21/70 |

OTHER PUBLICATIONS

Partial European Search Report from European Patent Application 94830577.6, filed Dec. 15, 1994.

Research Disclosure No. 345, Jan. 1993 Havant GB, p. 76 "Wafer–Bonding With Diamond–Like Carbon Films".

Patent Abstracts of Japan, vol. 11, No. 88 (E–490), Mar. 18, 1987 & JP–A–61 240629 (NEC Corp.).

* cited by examiner

*Primary Examiner*—Trung Dang
(74) *Attorney, Agent, or Firm*—Wolf, Greenfield & Sacks, P.C.; James H. Morris; Theodore E. Galanthay

(57) ABSTRACT

A wafer of semiconductor material for fabricating integrated devices, including a stack of superimposed layers including first and second monocrystalline silicon layers separated by an intermediate insulating layer made of a material selected from the group comprising silicon carbide, silicon nitride and ceramic materials. An oxide bond layer is provided between the intermediate layer and the second silicon layer. The wafer is fabricated by forming the intermediate insulating layer on the first silicon layer in a heated vacuum chamber; depositing the oxide layer; and superimposing the second silicon layer. When the stack of silicon, insulating material, oxide and silicon layers is heat treated, the oxide reacts so as to bond the insulating layer to the second silicon layer. As a ceramic material beryllium oxide, aluminium nitride, boron nitride and alumina may be used.

19 Claims, 5 Drawing Sheets

WAFER OF SEMICONDUCTOR MATERIAL FOR FABRICATING INTEGRATED DEVICES, AND PROCESS FOR ITS FABRICATION

CROSS REFERENCE TO RELATED APPLICATIONS

This application is a division of application Ser. No. 08/571,806, filed Dec. 13, 1995 now U.S. Pat. No. 5,855,693, entitled WAFER OF SEMICONDUCTOR MATERIAL FOR FABRICATING INTEGRATED DEVICES, AND PROCESS FOR ITS FABRICATION, which prior application is incorporated herein by reference.

BACKGROUND OF THE INVENTION

1. Field of the Invention

The present invention relates to a wafer of semiconductor material for fabricating integrated devices, and to a process for its fabrication.

2. Discussion of the Related Art

As is known, in the microelectronics industry, the substrate of integrated devices is commonly formed from monocrystalline silicon wafers. In recent years, however, by way of an alternative to all-silicon wafers, so-called SOI (Silicon-on-Insulator) wafers have been proposed. SOI wafers include two layers of silicon, one thinner than the other, separated by a layer of silicon oxide (see, for example, the article entitled: "Silicon-on-Insulator Wafer Bonding-Wafer Thinning Technological Evaluations" by J. Hausman, G. A. Spierings, U. K. P. Bierman and J. A. Pals, Japanese Journal of Applied Physics, Vol. 28, N. 8, August 1989, p. 1426–1443).

FIG. 1 shows a cross section of a portion of a SOI wafer 1 presenting a first (thicker) layer of monocrystalline silicon 2, an intermediate silicon oxide layer 3, and a second (thinner) layer of monocrystalline silicon 4 on which an epitaxial layer (not shown) may subsequently be grown. The intermediate oxide layer preferably has a thickness $L_1$ of 0.2 to 10 $\mu$m.

SOI wafers have recently attracted a good deal of attention on account of the major advantages of integrated circuits with substrates formed from such wafers, as compared with the same circuits with conventional monocrystalline silicon substrates. The advantages may be summed up as follows:
a) higher switching speed;
b) better immunity to noise;
c) low loss currents;
d) no latch-up;
e) reduced stray capacitance;
f) better resistance to radiation; and
g) higher component packing density.

A typical SOI wafer fabrication process will now be described with reference to the FIG. 2 diagram.

The process commences with two normally fabricated monocrystalline silicon wafers 10 and 11. Wafer 10 is the one eventually constituting the bottom base layer, and is accurately sized; while wafer 11 is the one which will eventually be thinned and bonded (via the interposition of an oxide layer) to wafer 10. Wafer 11 (also known as the "bond wafer") is oxidized thermally to form an oxide layer 12 covering it entirely; and, after being cleaned, wafers 10 and 11 are superimposed and heat treated at 1100° C. for roughly 2 hours to "bond" them together.

During bonding, the following chemical reaction takes place:

$$\equiv\text{SiOH} + \text{HOSi}\equiv => \equiv\text{Si—O—Si}\equiv + \text{H}_2\text{O} \quad (1)$$

wherein the SiOH groups are present in oxide layer 12; at the heat treatment temperature shown, $\text{OH}^-$ ions are present in oxide layer 12, to form a strong chemical bond between oxide layer 12 (and hence wafer 11) and wafer 10, and so form a semifinished wafer 13.

Semifinished wafer 13 is then surface ground to form a body 14, and finally lapped and polished to form wafer 1.

Despite the major advantages listed above, SOI wafers are of limited application in power circuits on account of the poor thermal conductivity of the silicon oxide layer. Silicon, in fact, is known to present a thermal conductivity of 150 W/(m° C.), as compared with 1.4 W/(m° C.) for silicon oxide (two orders of magnitude lower). As the total thermal resistance of the wafer equals the sum of the thermal resistances of the individual layers (in series with one another), wafer 1, for a given total thickness, presents a much greater thermal resistance as compared with a traditional monocrystalline silicon wafer. In other words, to achieve the same thermal resistance, silicon layer 2 would have to be thinned by a factor depending on the ratio between the conductivity of silicon oxide and monocrystalline silicon (as shown above, equal to roughly 100) and bearing in mind the thickness of the oxide layer. Such thinning, however, would impair the mechanical strength of the wafer, and is therefore unfeasible, at least for the great majority of applications.

In view of the continual reduction in component size and the need for operating at an increasingly high operating current density, SOI substrates therefore fail to provide for sufficient heat dissipation, thus resulting in excessively high junction temperatures, and impaired reliability of the components. In the case of power components, in particular, a limitation in current flow occurs. Such negative effects are especially damaging in the case of high-voltage integrated circuits requiring thicker intermediate oxide layers. Furthermore, in case of power pulses (e.g. in case of electrostatic discharges), heat cannot be dissipated and locally causes fast increases in temperature.

It is an object of the present invention to provide a wafer which exploits the inherent advantages of SOI technology, but which presents none of the above limitations of application.

SUMMARY OF THE INVENTION

According to the present invention, there are provided a wafer of semiconductor material for fabricating integrated devices, and a process for its fabrication.

In one aspect, the present invention includes a wafer of stacked layers including a first silicon layer, an insulating layer and a second silicon layer. The insulating layer can be formed of silicon carbide, silicon nitride, or a ceramic material, such as beryllium oxide, aluminum nitride, boron nitride and alumina. The insulating layer is formed so that it has a thermal conductivity preferably greater than 10 W/m° K. In another aspect of the invention, a bonding layer is interposed between the insulating layer and the second silicon layer. The bonding layer may be a polycrystalline silicon layer or an oxide layer, such as TEOS oxide, a chemical-vapor-deposited oxide, and a thermally grown oxide. In another aspect of the invention, the insulating layer is formed by thermal deposition in a vacuum chamber on a heated first silicon layer.

BRIEF DESCRIPTION OF THE DRAWINGS

A number of preferred, non-limiting embodiments of the present invention will be described by way of example with reference to the accompanying drawings, in which.

DETAILED DESCRIPTION

Figure 3:
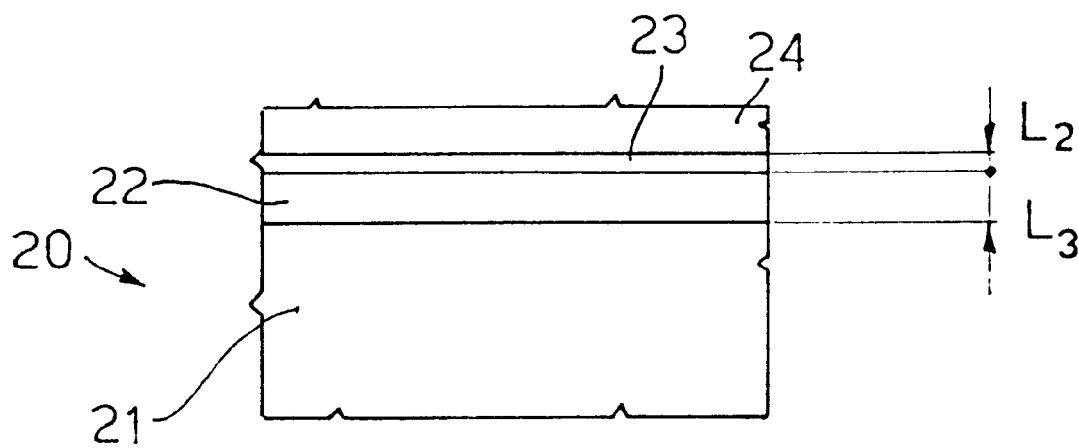
FIG. 3 shows a cross section of a wafer of semiconductor material in accordance with the present invention.

Number 20 in FIG. 3 indicates a wafer of semiconductor material, comprising a stack of superimposed layers, including: a first layer 21 of monocrystalline silicon; a layer 22 of electrically insulating material, but, of high thermal conductivity (preferably over 10 W/m° K.); a bond layer 23; and a second layer 24 of monocrystalline silicon.

More specifically, insulating layer 22 may include silicon carbide (SiC), silicon nitride ($Si_3N_4$) or a ceramic material such as beryllium oxide (BeO), aluminum nitride (AlN), boron nitride (BN) or alumina ($Al_2O_3$); and the thickness of insulating layer 22 depends on the maximum voltage the wafer is called upon to withstand, bearing in mind the dielectric rigidity of the material (which, for example, in the case of silicon carbide is roughly 300 V/$\mu$m, of silicon nitride is about 1000 V/$\mu$m and of single crystal alumina is about 500 V/$\mu$m).

Bond layer 23 may include of silicon oxide, thermal oxide, TEOS (tetraethylorthosilicate) oxide, CVD (Chemical-Vapour-Deposited) oxide or polycrystalline silicon, and is so selected as to ensure bonding to insulating layer 22. The bond layer presents a thickness ranging preferably between 200 Å and 0.2 $\mu$m. If insulating layer 22 includes silicon carbide, bond layer 23 preferably includes polysilicon or thermal oxide.

In addition to the advantages typical of SOI wafers, wafer 20 also presents a distinct improvement in thermal dissipation. For example, if layer 22 is made of silicon carbide, which presents a high thermal conductivity $\sigma_T$ of about 250 W/(m° K.), of beryllium oxide ($\sigma_T$=218 W/(m° K.)), of aluminium nitride ($\sigma_T$=200 W/(m° K.)), insertion of layer 22 within wafer 20 provides for improving the overall thermal conductivity. In any case, also the use of alumina ($\sigma_T$=17 W/(m° K.)) or silicon nitride ($\sigma_T$=19 W/(m° K.) as a single crystal, $\sigma_T \geq$ 3–5 W/(m° K.) if obtained from high temperature CVD) improves the overall thermal conductivity with respect to prior art SOI wafers. In particular, in case of an insulating material with high conductivity, the deficiency induced by bond layer 23 may be well compensating, since the bond layer 23, being thin, does not present a high thermal resistance anyway.

Adhesion of layer 22 to monocrystalline silicon layer 21 is good and, in case of an insulating layer having a coefficient of linear thermal expansion equal or similar to that of monocrystalline silicon (roughly 2.5×10$^{-6}$/° C.), low stress is generated between the two layers. In particular, this is the case for silicon carbide with a coefficient of 3.3×10$^{-6}$/° C. and of silicon nitride with a coefficient of 2.8×10$^{-6}$/° C. (single crystal) and of 4×10$^{-6}$/° C. (CVD deposited).

Figure 4:
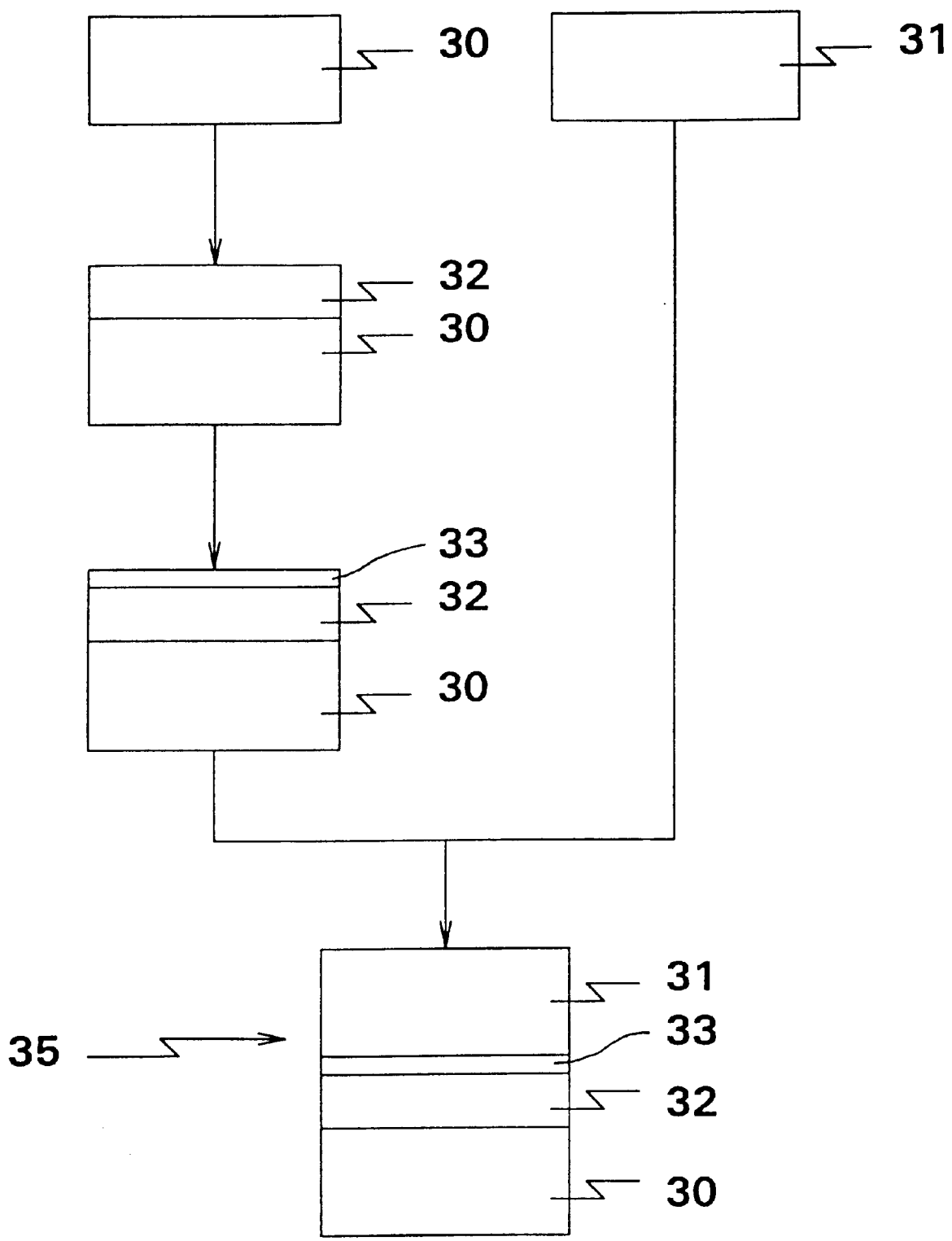
FIG. 4 shows a flow chart of one embodiment of the process according to the present invention.

A process for fabricating wafer 20 with a layer 22 including silicon carbide and deposited oxide will be described with reference to FIG. 4. The process commences with two wafers 30, 31 of monocrystalline silicon; wafer 30 being the one eventually constituting the bottom portion of the substrate; and wafer 31 being the one eventually constituting the thinner top portion. Then, a layer 32 of silicon carbide is grown on wafer 30 in a reaction chamber. In particular, silicon carbide layer 32 may be grown as a single crystal using the process disclosed in the article "Chemical Vapor Deposition of Single Crystalline β-SiC Films on Silicon Substrate with Sputtered SiC Intermediate Layer, S. Nishina, Y. Hazuki, H. Matsunami, T. Tanaka, J. Electrochem. Soc.: SOLID STATE SCIENCE AND TECHNOLOGY, December 1980. In this case, the sputtered intermediate layer does not prejudice the properties of the substrate, having a small thickness. In the alternative, a silicon carbide insulating layer 22 may be grown in amorphous phase, e.g. using an epitaxial growing method, and then recrystallized to obtaining a monocrystalline layer, as disclosed for example in the article "Complete recrystallization of amorphous silicon carbide layers by ion irradiation" V. Heera, R. Kögleer, W. Skorupa, Appl. Phys. Lett. 67 (14), Oct. 2, 1995.

Figure 2:
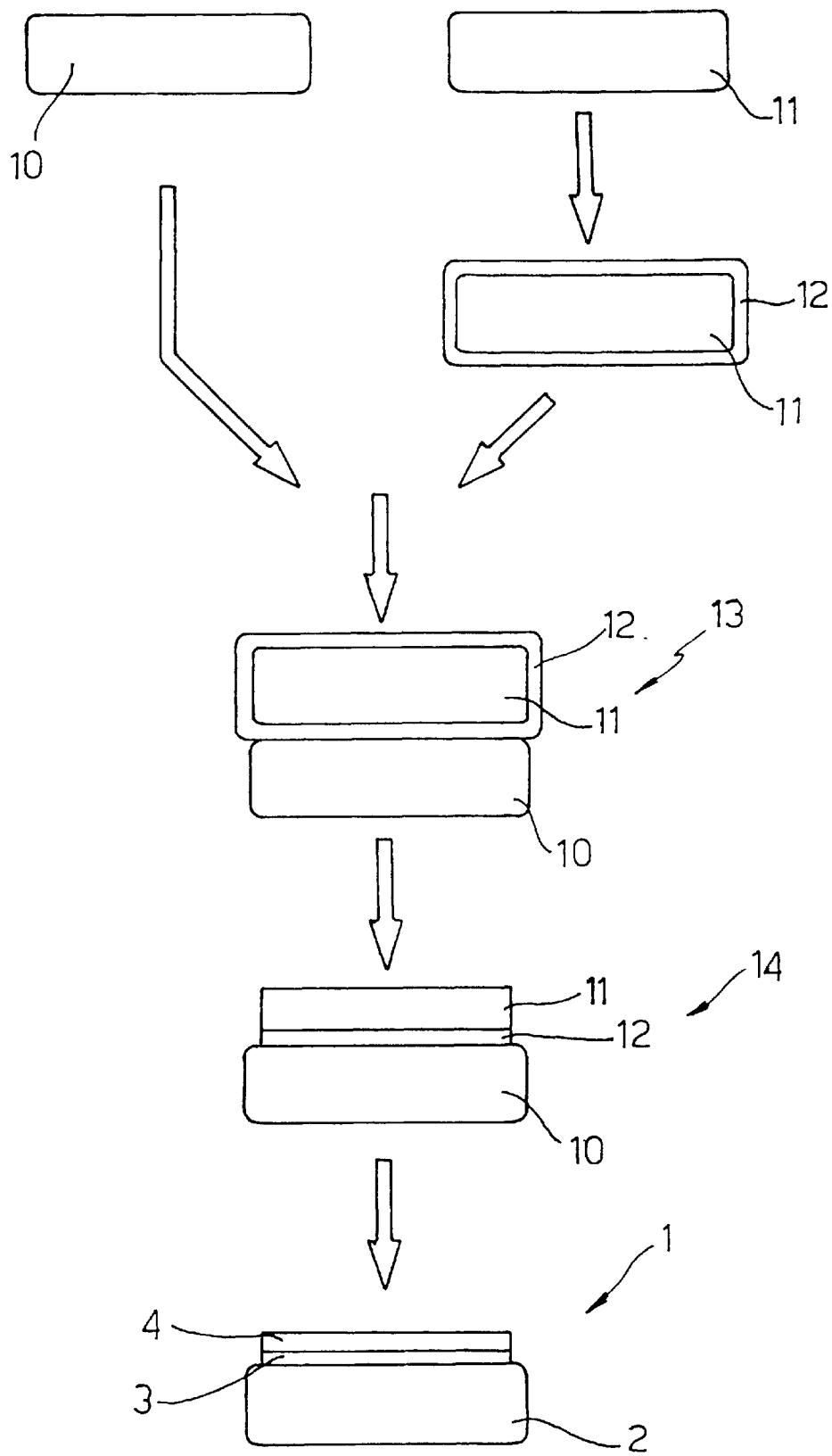
FIG. 2 shows the process for fabricating the FIG. 1 wafer.

Finally, monocrystalline silicon wafer 31 is bonded to the silicon carbide layer either directly or by means of a bond layer 33. If an oxide layer 33 is used for bonding, this is preferably in the form of a very thin layer, less than 500 Å, of thermal silicon oxide. Bonding of monocrystalline wafer 31 is carried out using a process similar to the one described with reference to FIG. 2, exploiting reaction (1), and wafer 35 is obtained.

Alternatively, as a bond layer, a polycrystalline silicon layer may be used. In this case, a polycrystalline silicon layer 33 of a few micrometers in thickness is first deposited; the bond layer 33 is ground and polished (mirror machined); monocrystalline silicon wafer 31 is bonded to the polycrystalline silicon layer using a process similar to the one described with respect to FIG. 2 for bonding oxide layer 12 to wafer 10, for example at a temperature of 1100° C. for 2 hours in a $O_2$ dry environment. Since silicon oxide layer 33 contains bonded hydrogen, in the silicon-oxygen matrix, in the form of SiOH, it is hydrophilic and, when heat treated, permits the reaction (1) indicated with reference to FIG. 2, so as to bond monocrystalline silicon layer 31 to carbide layer 32, and form wafer 35 which may then be ground and polished in the usual way to form wafer 20 in FIG. 3.

Wafer 35 presents extremely good thermal characteristics, by virtue of silicon carbide presenting a thermal conductivity of 350 W/m° C. and polycrystalline silicon presenting a thermal conductivity of 50–85% that of monocrystalline silicon (roughly 75–125 W/m° K.).

For manufacturing a substrate with an insulating layer of silicon nitride, a similar method to the method described with reference to FIG. 6 may be used. In particular, the silicon nitride layer 32 may be obtained by LPCVD (Low Pressure CVD) at a relatively high temperature (roughly 900° C.).

Figure 1:
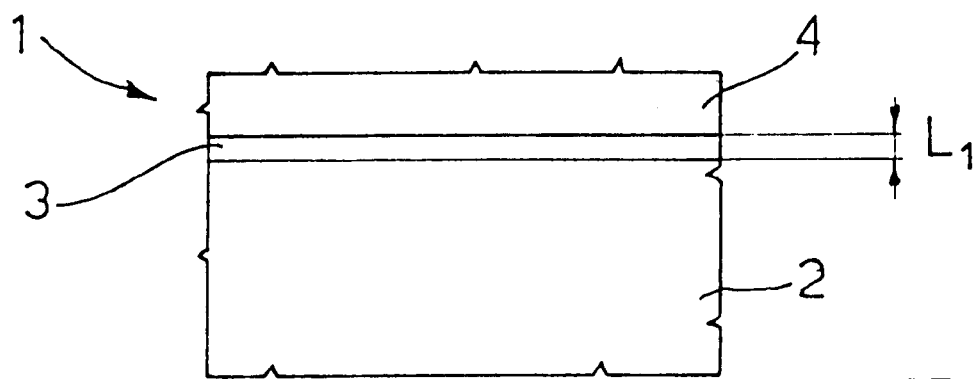
FIG. 1 shows a known type of SOI wafer.
Figure 5:
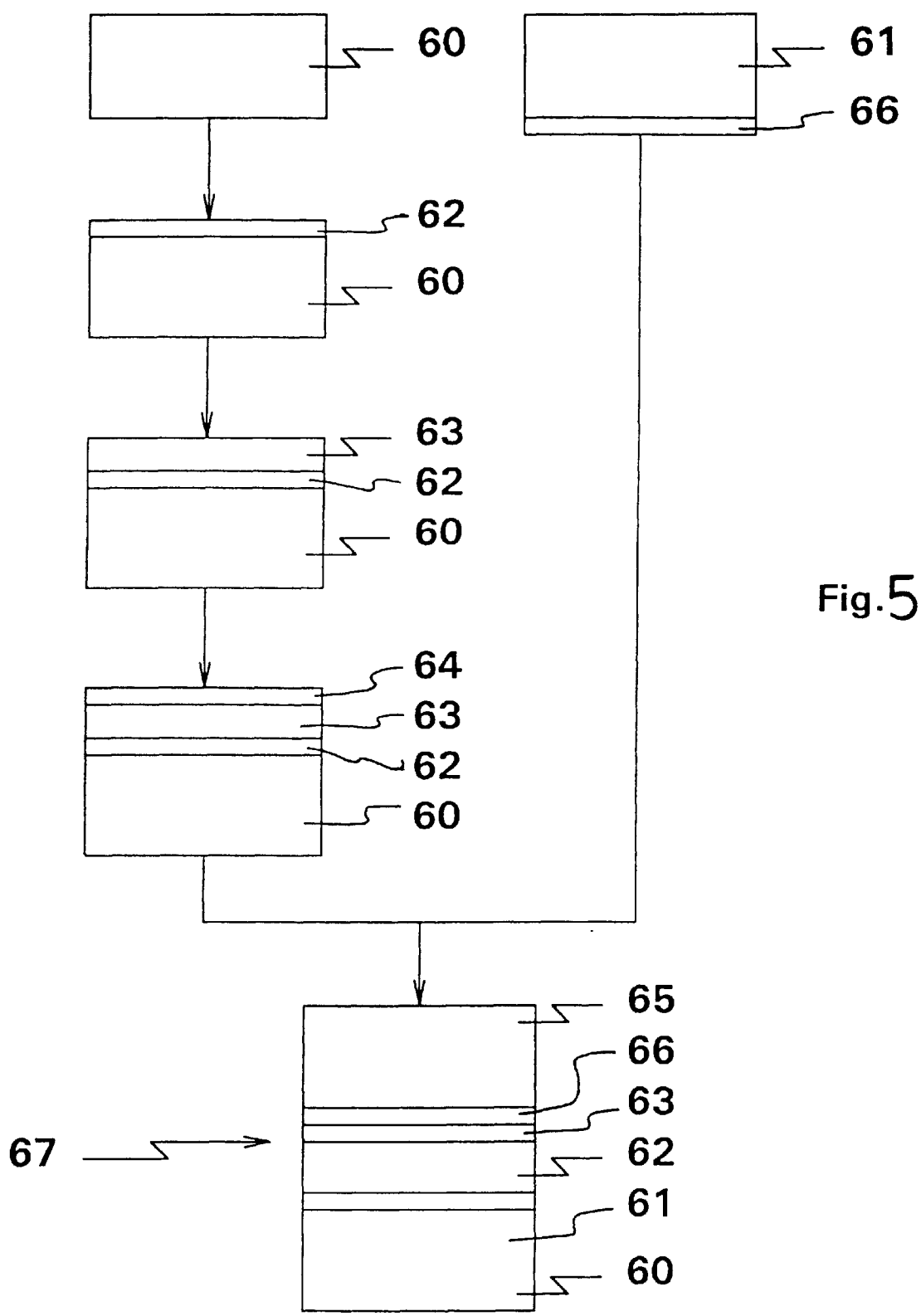
FIG. 5 shows a flow chart of another embodiment of the process according to the present invention.

In the alternative, the silicon nitride layer may be obtained according to the process shown schematically in FIG. 5 and described hereinbelow. According to the process of FIG. 5, a monocrystalline silicon wafer 60 is thermally oxidized at 900° C. in an $O_2$ dry environment for growing a silicon oxide layer 62 of, e.g., 280 Å thickness. Then a silicon nitride layer 63 is grown from a mixture of silane and ammonia, e.g. using the HTCVD (High Temperature Chemical Vapour Deposition) method at 900° C. using the reaction tube and CVD system shown in FIG. 1 of the above cited article to Nishina, Hazuki, Matsunami and Tanaka. Layer 63 may have a thickness of 1400 Å. Then a silicon oxide (preferably a TEOS oxide) layer 64 is grown with a thickness of 500 Å and the monocrystalline silicon wafer 61, previously oxidized, is bonded. The surface oxide layer 66 covering the wafer 61 is very thin (e.g. 50 Å), for example the native oxide may be exploited.

From indirect evaluations made by the inventors, the thermal conductivity of HTLPCVD deposited silicon nitride has been found to be at least 2–3 times the thermal conductivity of silicon oxide; therefore CVD silicon nitride offers already an advantage with respect to prior art SOI wafers. A much better improvement may be obtained by using sintered silicon nitride having a $\sigma_T$ of 19 W/m° K.

Figure 6:
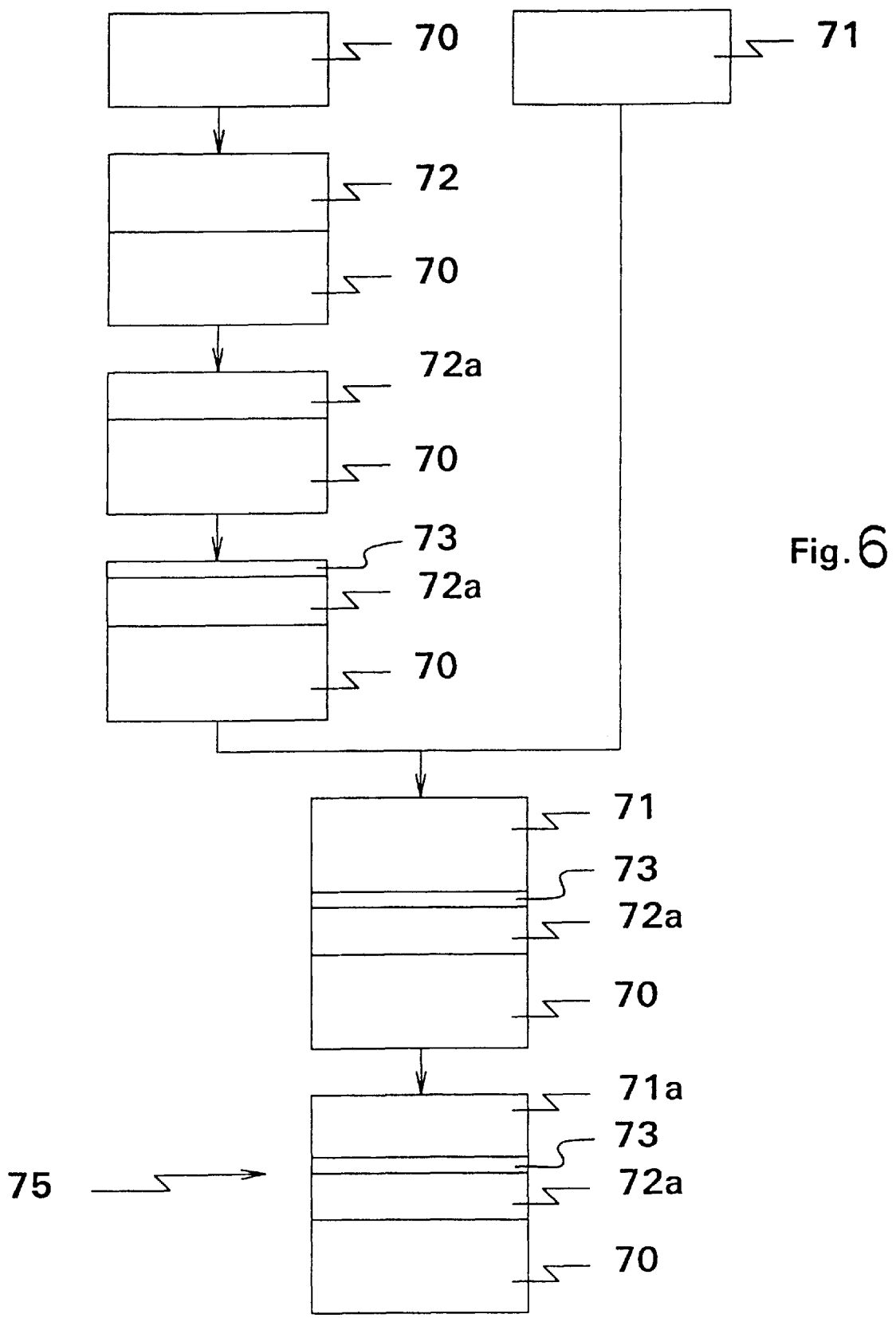
FIG. 6 shows a flow chart of a further embodiment of the process according to the present invention.

A fabrication process using sintered silicon nitride is shown in FIG. 6, wherein a first monocrystalline silicon wafer 70 is firstly bonded to a sintered silicon nitride layer 72. Then layer 72 is lapped, obtaining layer 72a with a thickness of 1 μm; a TEOS silicon oxide layer 73 is deposited and monocrystalline silicon layer 71 is thermally bonded according to reaction (1). Finally, layer 71 lapped to obtain layer 71a.

The above process including a sintered insulating layer may be used also in case of insulating layer 72 made of beryllium oxide, aluminium nitride and alumina.

Clearly, changes may be made to the wafer and fabrication process as described and illustrated herein without, however, departing from the scope of the present invention. In particular, as bond layer 23 provides solely for bonding, it may be eliminated in the event the fabrication process allows bonding monocrystalline silicon layer 21 directly to insulating layer 22. Moreover, the bond layer may be formed from any suitable bonding material, deposited or thermally grown, provided that its nature or selected thickness has substantially no effect on the thermal conductivity of the wafer.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for fabricating a wafer of semiconductor material comprising the steps of:
   forming, on a first silicon layer, an intermediate insulating layer made of a monocrystalline material selected from a group comprising silicon carbide, silicon nitride and ceramic materials; and
   bonding a second silicon layer to said insulating layer.

2. A process for fabricating a wafer of semiconductor material comprising the steps of:
   forming, on a first silicon layer, an intermediate insulating layer made of a monocrystalline material selected from a group comprising silicon carbide, silicon nitride and ceramic materials; and
   bonding a second silicon layer to said insulating layer;
   wherein said ceramic material is selected from a group comprising beryllium oxide, aluminum nitride, boron nitride and alumina.

3. A process as claimed in claim 1, wherein said first and second silicon layers are of monocrystalline silicon.

4. A process as claimed in claim 1, wherein said bonding step includes the step of forming a bond layer between said insulating layer and said second silicon layer.

5. A process as claimed in claim 4, wherein said step of forming a bond layer comprises the steps of:
   forming a silicon oxide layer on said insulating layer; and
   placing said second silicon layer on said silicon oxide layer; and
   heat treating said wafer to activate the reaction:

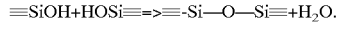

6. A process as claimed in claim 5, wherein said step of forming a silicon oxide layer comprises the step of depositing a TEOS silicon oxide layer on said insulating layer.

7. A process as claimed in claim 5, wherein said step of forming a silicon oxide layer comprises the step of depositing a CVD silicon oxide layer on said insulating layer.

8. A process as claimed in claim 5, wherein said step of forming a silicon oxide layer comprises the step of forming a thermal oxide layer on said insulating layer.

9. A process for fabricating a wafer of semiconductor material comprising the steps of:
   forming, on a first silicon layer, an intermediate insulating layer made of a material selected from a group comprising silicon carbide, silicon nitride and ceramic materials; and
   bonding a second silicon layer to said insulating layer;
   wherein said bonding step includes a step of forming a bond layer between said insulating layer and said second silicon layer and a step of depositing a polycrystalline silicon layer on said insulating layer.

10. A process as claimed in claim 1, wherein said step of forming said insulating layer of silicon carbide comprises the steps of:
    heating said first silicon layer;
    supplying a gas including a mixture of hydrocarbons and silane; and
    activating said gas.

11. A process for fabricating a wafer of semiconductor material comprising the steps of:
    forming, on a first silicon layer, an intermediate insulating layer made of a material selected from a group comprising silicon carbide, silicon nitride and ceramic materials; and
    bonding a second silicon layer to said insulating layer;
    wherein said step of forming said insulating layer of silicon carbide comprises the steps of:
    growing an amorphous-phase silicon carbide layer; and
    recrystallizing said amorphous-phase silicon carbide layer as a monocrystalline silicon carbide layer.

12. A process as claimed in claim 1, wherein said step of forming said insulating layer comprises the step of growing a CVD silicon nitride layer.

13. A process as claimed in claim 1, wherein said step of forming said insulating layer of silicon nitride comprises the steps of:
    thermally growing a thermal silicon oxide layer on said first silicon layer;
    supplying a gas including a mixture of silane and ammonia; and
    activating said gas.

14. A process as claimed claim 5, wherein said bonding step comprises the steps of:
    forming a first bonding silicon oxide layer on said insulating layer;
    forming a second bonding silicon oxide layer on said second silicon layer;
    bonding said first and second boding silicon oxide layers.

15. A process as claimed claim 14, wherein said first bonding silicon oxide layer has a thickness in the range 400–600 Å.

16. A process as claimed claim 14, wherein said second bonding silicon oxide layer is a native oxide.

17. A process for fabricating a wafer of semiconductor material comprising the steps of:

forming, on a first silicon layer, an intermediate insulating layer made of a material selected from a group comprising silicon carbide, silicon nitride and ceramic materials; and bonding a second silicon layer to said insulating layer;

wherein said step of forming said insulating layer comprises the steps of:

forming a sintered insulating layer; and bonding said sintered insulating layer to said first silicon layer.

18. A process as claimed in claim 17, further comprising the steps of:

after said sintered insulating layer bonding step, polishing said bonded sintered insulating layer; and forming an oxide bond layer on said sintered insulating layer.

19. A process as claimed in claim 17, wherein the sintered insulating layer is made of silicon nitride.

* * * * *